United States Patent
Reid et al.

(10) Patent No.: US 7,622,399 B2
(45) Date of Patent: Nov. 24, 2009

(54) **METHOD OF FORMING LOW-*K* DIELECTRICS USING A RAPID CURING PROCESS**

(75) Inventors: Jason Reid, San Jose, CA (US); Nigel Hackera, Espoo (FI); Nina Pirilä, Espoo (FI); Juha Rantala, Espoo (FI); William McLaughlin, Espoo (FI)

(73) Assignee: Silecs Oy, Espoo (FI)

( * ) Notice: Subject to any disclaimer, the term of this patent is extended or adjusted under 35 U.S.C. 154(b) by 228 days.

(21) Appl. No.: 10/796,286

(22) Filed: Mar. 10, 2004

(65) Prior Publication Data

US 2005/0064726 A1    Mar. 24, 2005

Related U.S. Application Data

(60) Provisional application No. 60/504,992, filed on Sep. 23, 2003.

(51) Int. Cl.
*H01L 21/469* (2006.01)

(52) U.S. Cl. .............. 438/781; 438/790; 438/795

(58) Field of Classification Search .............. 438/781
See application file for complete search history.

(56) References Cited

U.S. PATENT DOCUMENTS

| | | | | |
|---|---|---|---|---|
| 5,059,448 A * | 10/1991 | Chandra et al. | ............. | 427/557 |
| 6,030,904 A * | 2/2000 | Grill et al. | ............. | 438/781 |
| 6,303,524 B1 * | 10/2001 | Sharangpani et al. | ....... | 438/780 |
| 6,372,666 B1 * | 4/2002 | Ramos et al. | ............... | 438/781 |
| 6,518,204 B2 * | 2/2003 | Yamakawa et al. | .......... | 438/780 |
| 2001/0017402 A1* | 8/2001 | Usami | ........................ | 257/642 |
| 2003/0092854 A1* | 5/2003 | Yahagi et al. | ............... | 525/474 |

* cited by examiner

*Primary Examiner*—Stephen W Smoot
(74) *Attorney, Agent, or Firm*—Kubovcik & Kubovcik

(57) ABSTRACT

A method of forming a low dielectric constant structure. The method comprises providing at a first temperature a dielectric material having a first dielectric constant and a first elastic modulus, and curing the dielectric material by a thermal curing process, in which the material is heated to a second temperature by increasing the temperature at an average rate of at least 1° C. per second. As a result a densified, dielectric material is obtained which has a low dielectric constant.

55 Claims, 1 Drawing Sheet

METHOD OF FORMING LOW-*K* DIELECTRICS USING A RAPID CURING PROCESS

This application claims priority of U.S. Provisional Patent Application Ser. No. 60/504,992 filed Sep. 23, 2003.

BACKGROUND OF THE INVENTION

1. Field of the Invention

The present invention relates to thin films suitable as dielectrics in integrated circuits (IC's) and for other similar applications. In particular, the invention concerns a process and curing method for thin films comprising polymer compositions of organic, inorganic or organic-inorganic materials.

2. Description of Related Art

Built on a semiconducting substrate, integrated circuits comprise millions of transistors and other devices, which communicate electrically with one another and outside packaging material through multiple levels of vertical and horizontal wiring embedded in a dielectric material. Within the multilayer metallization structure, "vias" comprise the vertical wiring, whereas "interconnects" comprise the horizontal wiring. Fabricating the metallization can involve the successive depositing and patterning of multiple layers of dielectric and metal to achieve electrical connection among transistors and to outside packaging material. The patterning for a given layer is often performed by a multi-step process consisting of layer deposition, photoresist spin, photoresist exposure, photoresist develop, layer etch, and photoresist removal on a substrate. Alternatively, the metal may sometimes be patterned by first etching patterns into a dielectric, filling the pattern with metal, then subsequently chemical mechanical polishing the metal so that the metal remains embedded only in the openings of the dielectric. As an interconnect material, aluminum has been utilized for many years due to its high conductivity, good adhesion to $SiO_2$, known processing methods (sputtering and etching) (and low cost). Aluminum alloys have also been developed over the years to improve the melting point, diffusion, electromigration and other qualities as compared to pure aluminum. Spanning successive layers of aluminum, tungsten has traditionally served as the conductive via plug material. Silicon dioxide (dielectric constant of around 4.0) has been the dielectric of choice, used in conjunction with aluminum-based and tungsten-based interconnects and via for many years.

The drive to faster microprocessors and more powerful electronic devices in recent years has resulted in very high circuit densities and faster operating speeds, which in turn have required higher conductivity metals and lower-k dielectrics (preferably below 3.0, more preferably below 2.5 dielectric constant). In the past few years, VLSI (and ULSI) processes have been moving to copper damascene processes, where copper (or a copper alloy) is used for the higher conductance in the conductor lines and a spin-on or CVD process is used for producing low-k dielectrics which can be employed for the insulating material surrounding the conductor lines. To circumvent problems with etching, copper along with a barrier metal is blanket deposited over recessed dielectric structures consisting of interconnect and via openings and subsequently polished in a processing method known as the "dual damascene." The bottom of the via opening is usually the top of an interconnect from the previous metal layer or, in some instances, the contacting layer to the substrate.

In addition to being photopatternable, the dielectric IC material should be easy to deposit or form, preferably at a high deposition rate and at a relatively low temperature. Once the material has been deposited or formed, it should also be readily patterned, and preferably patterned with small feature sizes if needed. The patterned material should preferably have low surface and/or sidewall roughness. It might also desirable that such materials be hydrophobic to limit uptake of moisture (or other fluids), and be stable with a relatively high glass transition temperature (not degrade or otherwise physically and/or chemically change upon further processing or when in use).

Summarizing: aside from possessing a low dielectric constant, the ideal dielectric should have the following properties:

1. High modulus and hardness in order to bind the maze of metal interconnects and vias together as well as abet chemical mechanical polishing processing steps.
2. Low thermal expansion, typically less than or equal to that of metal interconnects.
3. Excellent thermal stability, generally in excess of 400° C.
4. No cracking, excellent fill and planarization properties
5. Excellent adhesion to dielectric, semiconductor, and metal materials.
6. Sufficient thermal conductivity to dissipate joule heating from interconnects and vias.
7. Material density that precludes absorption of solvents, moisture, or reactive gasses.
8. Allows desired etch profiles at very small dimensions.
9. Low current leakage, high breakdown voltages, and low loss-tangents.
10. Stable interfaces between the dielectric and contacting materials.

By necessity, low-k materials are usually engineered on the basis of compromises. Silicate-based low-k materials can demonstrate exceptional thermal stability and usable modulus but can be plagued by brittleness and cracking. Organic materials, by contrast, often show improved material toughness, but at the expense of increased softness, lower thermal stability, and higher thermal expansion coefficients.

Porous materials sacrifice mechanical properties and possess a strong tendency of absorbing chemicals used in semiconductor fabrication leading to reliability failures. Furthermore these porous materials are mesoporous or microporous with pore diameters in excess of 2 nm and pore volumes greater than 30%. Fluorinated materials can induce corrosion of metal interconnects, rendering a chip inoperative. Generally, in low-k materials, mechanical robustness and thermal conductivity has been sacrificed as compared to their pure silicon dioxide analogues, making integration into the fabrication flow very challenging.

Further, known materials comprising exclusively inorganic bonds making up the siloxane matrix are brittle and have poor elasticity at high temperatures.

Organosiloxane materials are typically deposited via spin-on processing, however Chemical Vapor Deposition (CVD) is also a viable technique for—the deposition of these materials. For example, in the published International Patent Application No. WO 03/015129, organosilicone low-k dielectric precursors are described which are useful for producing porous, low-k dielectric, SiOC thin films, wherein the organosilicon precursor comprises at least one cleavable, organic functional group that upon activation rearranges, decomposes and/or cleaves as a highly volatile liquid and/or gaseous by-product. Other organosilicone precursors comprising Si—O—C-in-ring cyclic siloxane compounds for use as precursors for forming insulator films by CVD are described in U.S. Pat. No. 6,440,876. When these siloxane precursors are applied to the surface of a semiconductor or integrated circuit, they will react on the wafer surface forming a dielectric film. The ring opening polymerization of these cyclic compounds forms a dielectric film or layer that will have a k value between 2.0 and 2.5.

U.S. Pat. No. 6,242,339 discloses an interconnection structure, in which a phenyl group, bonded to a silicon atom, is introduced into silicon dioxide in the organic-containing silicon dioxide as a material for the interlevel insulating film. Such a film can be processed just as well as a conventional CVD oxide film, it has a relative dielectric constant as low as that of a hydrogen silsesquioxane (HSQ) film, and can adhere strongly to organic film, oxide film or metal film. According to the cited patent, the number of devices that can be integrated within a single semiconductor integrated circuit can be increased without modifying the conventional semiconductor device manufacturing process to provide a high-performance semiconductor integrated circuit, operative at a high speed and with lower power dissipation.

However, in spite of advantages achieved by using the known precursors, there are still disadvantages of the known methods of their manufacture.

First, the manufacture of these precursors is inefficient because the chemical reactions have low yields, and the processes are expensive and produce toxic byproducts. Further, it is difficult to eliminate redimerization of the reactive intermediates. When deposited along with polymers, these dimers decrease the thermal stability and mechanical strength of the film. Moreover, materials currently reaching a dielectric constant of less than 2.5 are typically highly porous, which makes the integration of such materials into the semiconductor device very difficult.

Thus, the prior art contains no examples of ways of processing dielectric material precursors for semiconductor manufacture to provide dielectric materials, which have desired properties of low dielectric constant with low controlled micro porosity, high thermal stability, and low cost.

SUMMARY OF THE INVENTION

It is an aim of the present invention to eliminate the disadvantages of the prior art and to improve the dielectric constant performance of known organic, inorganic and organic-inorganic materials through rapid thermal curing and to provide novel low dielectric constant thin films, which have excellent mechanical and thermal properties.

It is a second object of the invention to provide methods of producing novel poly(organo siloxane) compositions which are suitable for the preparation of thin films having low dielectric constant. Materials providing dielectric constant values of <2.7, <2.5 and <2.3 are also claimed.

It is a third object of the invention to provide a method of patterning dielectric films in semiconductor devices.

It is a fourth object of the invention to have achieve a rapid curing process, which allows the control the micro porosity of the material and furthermore tunability of dielectric constant of the thin film by adjusting dT, i.e., the difference between minimum and maximum temperature in the rapid curing process.

Still, a fifth object of the invention is to provide novel molecules for forming of low dielectric constant material formed by a spin-on or a CVD (Chemical Vapor Deposition) methods in combination with curing method defined as rapid thermal anneal.

These and other objects, together with the advantages thereof over the known dielectric thin films and methods for the preparation thereof, which shall become apparent from specification which follows, are accomplished by the invention as hereinafter described and claimed.

The invention is based on the idea of forming a dielectric material layer, such as a polymer film, on a semiconductor substrate by activating polymerization and densification reactions by rapid curing processing so as to produce a densified material. "Rapid curing processing" means that the temperature is rapidly increased during the heat curing of the starting material, which optionally has been pre-cured, the heating rate generally exceeding 1 degree Centigrade per second. The densified material obtained is typically nonporous and has an excellent relative dielectric constant. The dielectric constant is usually lower than 2.6, preferably lower than 2.5.

According to a particular embodiment, the present method of forming a low dielectric constant structure, comprises the steps of:

providing a dielectric material having a first elastic modulus; and curing the nonporous dielectric material by a thermal curing process, in which the material is heated by increasing the temperature at an average rate of at least 1° C. per second, to produce a densified dielectric material having a second elastic modulus, which is greater than the first elastic modulus.

Considerable advantages are achieved by the invention. Thus, when using a nonporous dielectric starting material, nonporous materials having a porosity volume of less than 30% and a pore radius of approximately 1 nm or less, can be produced. These materials have a relative dielectric constant of less than 2.6 and high elasticity (Young's modulus 4 GPa or higher). The process is faster than the present day processes, cutting processing times to one sixth or less.

Advantageously, the method can be applied to a number of various materials, including conventional dielectrics, which are obtainable by hydrolysis and condensation of one or more silicon compounds, which yield an at least partially cross-linked siloxane structure. The rapid thermal curing process is applicable to curing of deposited or pre-annealed films made by spin-on or CVD deposition, resulting in low dielectric constant films. The invention can be used for forming dense or micro-porous films by adjusting the process parameters. An improvement of at least 5% in dielectric performance is obtained by applying the invented curing method.

According to the invention, an uncomplicated process is achieved in which semiconductor devices can be produced by first preparing siloxane compositions by hydrolysis and condensation of suitable reactants, by applying the prepared compositions on a substrate in the form of a thin layer, patterning the film by selective radiation and developing the radiated film and finally annealing the formed structure by the present curing method. Although particular advantages are obtained for nonporous materials, the present invention can also be applied to starting materials containing porogens, which give rise to porosity in the final dielectric materials.

Next, the invention will be examined in more detail with the help of a detailed description and with reference to the attached drawing and a number of chemical working examples.

BRIEF DESCRIPTION OF THE DRAWING

The attached drawing (FIG. 1) shows in graphical form the dielectric constant of seven different materials as a function of the dT of the curing process.

DETAILED DESCRIPTION OF THE INVENTION

Figure 1:
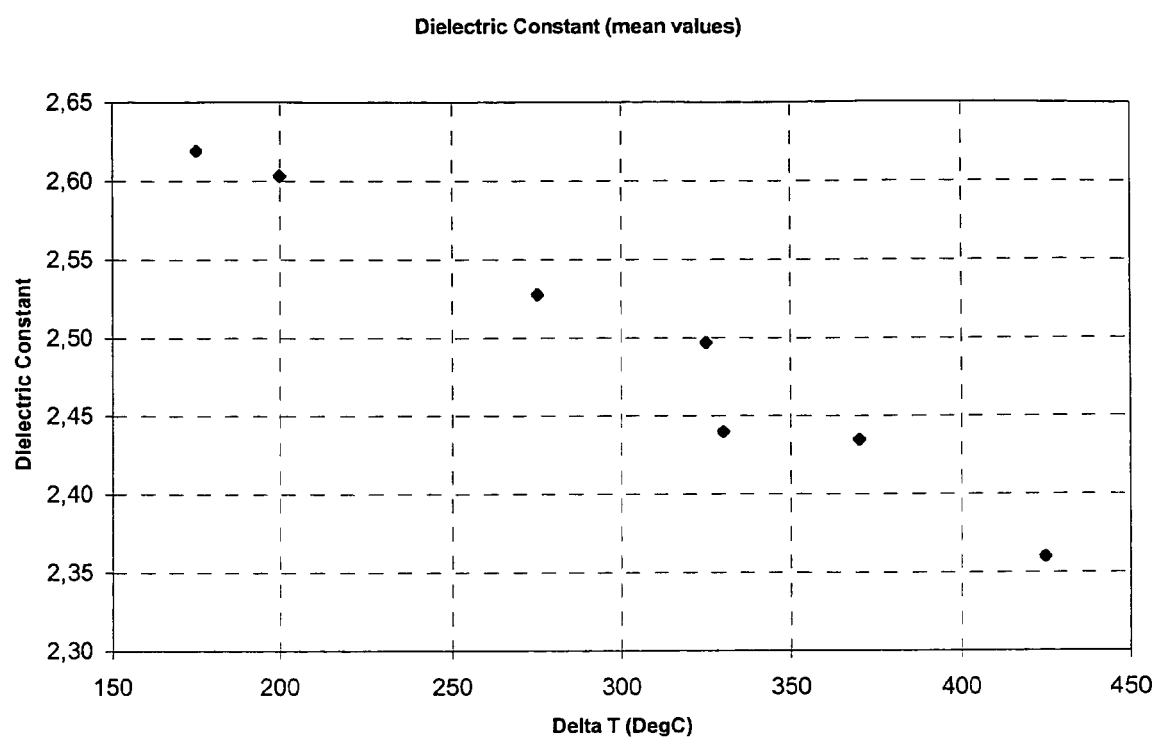

The present invention relates to a method of forming a low dielectric constant structure by rapid thermal curing (RTD). In such a process, the dielectric material is cured (densified and/or cross-linked) by increasing the temperature of the material at a rate, which is at least 6 times faster than in conventional curing. As a result, the heating ramp (the time it takes to reach curing temperature) is steep. The temperature is increased by at least 1° C./second, on an average. The term "increasing the temperature at an average rate of at least 1° C. per second", as used in the present context, means that during the period(s) of temperature increase, the average rate (dT/dt) is at least 1° C. per second. The periods of temperature increase can, however, be interrupted by at least one interval of constant temperature or even of at least one interval during which the temperature is lowered, i.e. the material is cooled.

After the deposition of the initial dielectric material on a suitable support, in particular on a semiconductor substrate, the material can optionally be pretreated, as will be explained below in more detail, and then cured by a thermal curing process, in which the material is rapidly heated to an increased (second) temperature. The temperature can be increased at an average rate of at least 1° C., preferably at least 10° C., in particular at least 30° C., per second. Thus, a densified nonporous dielectric material having an elastic modulus, which is greater than the elastic modulus of the starting material, can be obtained.

Typically, the temperature is increased at 10 to 70° C. per second.

Accordingly, the polymerization and densification reactions of the material are activated in a rapid curing furnace so that the relative dielectric constant of the dielectric film is lower than a predetermined value. Such a predetermined value corresponds to that of a conventional furnace, which means a furnace in which the material is heated at a rate of about 10 deg C. or less per minute and in which it is cured for extensive periods of at least 15 minutes, typically more than 30 minutes. By the present process, the dielectric constant of the same material will be decreased by more than 0.2 as a result of the rapid thermal curing.

In the preferred embodiment of the invention, in which the "rapid thermal curing" covers at least a significant part, typically at least 10%, preferably at least 30%, in particular at least 50% of the whole curing process, in terms of processing time or in terms of the total temperature range, the actual curing time will be shorter than conventionally. Still, it is possible to combine the present rapid thermal curing with conventional curing at fixed temperature carried out over extended times amounting to several hours, as will be explained below. Typically, when the curing of the material essentially takes place with the rapid thermal curing method according to the present invention, the curing time is one sixth of the conventional time in the same heating tool.

The temperature difference between the starting temperature and the actual curing temperature is at least 100° C., typically at least 150° C. At larger temperature differences, lower dielectric constants are achieved.

According to one embodiment, the rapid thermal curing method is applied to the starting materials and the material is processed with that method from ambient temperature (room temperature) up to the final curing temperature.

Normally, the rapid thermal curing conditions are employed with respect to heating at about 100° C. or more. Thus, according to a preferred embodiment, a nonporous dielectric material is provided by conventional processing, e.g. by a spin-on or CVD process. The temperature (also called "the first temperature") of the typically paste-like material is in the range of 100 to 200° C.

It is particularly preferred to apply the rapid thermal curing at least in the higher temperature ranges of the curing process—such temperatures range from 300° C. or more up to the final curing temperature. The latter temperature is 400° C. or more (conventionally up to 425° C., in particular up to 450° C.).

As mentioned above, the temperature difference between the second and the first temperature should be large, preferably it is at least 100° C., more preferably at least 150° C., suitably at least 200° C., and in particular in the range of from 225 to 425° C., and most preferably at least 275° C.

It is possible to divide the curing processing from the starting temperature to the final temperature into several substeps (e.g. 2 to 100 heating steps). Such steps can each be carried out according to the invention by rapid thermal curing. However, it is also possible to carry out some of the steps with conventional curing and others with rapid curing treatments. According to one preferred embodiment, the rapid thermal curing covers—as discussed above—at least the last step of heating the material up to the final curing temperature.

Usually the processing of the material according to the method of the present invention takes 0,5 to 10 minutes, depending on the temperature difference between the initial temperature and the target temperature and also on whether the treatment is continuous or intermittent (divided into substeps). Clearly, even if the material to be treated is kept at ambient temperature and the target temperature is above 400° C., it will take less than 5 minutes to raise the temperature by continuous ramping at a rate of more than 1° C. per second. Thus, according to preferred embodiments, the temperature is increased over a time period of 5 minutes or less, in particular a time period of 1 minute or less.

The materials produced by the present invention will have quite interesting properties.

Thus, for instance the following combinations of properties can be obtained:
Porosity (<30%) with k (<2.4);
Porosity (<30%) with modulus (>6 GPa);
k (<2.4) with modulus (>6 GPa);
Porosity (<30%) with CTE (<35 ppm/deg C.);
Modulus (>6 GPa) with CTE (<35 ppm/deg C.); and/or
k (<2.4) with CTE (<35 ppm/deg C.)

According to a further preferred embodiment, the material is free from porogens in order to provide a nonporous dielectric material. The elastic modulus of the paste-like material is low.

The dielectric constant of the material is 2.60 or less, preferably 2.50 or less, in particular 2.40 or less. The CTE of the film is less than $20*10^{-6}$ 1/deg C.

The etch rate of the film is comparable to silicon dioxide etch rate in a parallel plate etcher.

Typically, the material produced according to the present invention can be characterized as being "nonporous" which, in the present context means, in particular, that the porosity is low, typically less than 30%, preferably less than 20%, in particular less than 15% (by volume), and the average pore size is less than 5 nm, preferably less than 2 nm and in particular less than 1 nm. As a result of the processing, the electronic polarizability of the film is decreased more than 0.1 compared to a predetermined value obtained by conventional processing, as explained above.

The Young's modulus of the film is higher than 4 GPa after curing, preferably it is higher than 5 GPa after curing. The change in elastic modulus is 4 GPa or higher.

The present film can be formed on a semiconductor substrate. In particular, it is provided on a semiconductor substrate in alternating areas with an electrically conductive material. The electrically conductive material comprises, for example, aluminum or copper.

Alternating areas can be formed by depositing and patterning the dielectric material, followed by depositing the electrically conductive material. The depositing of the dielectric material and electrically conductive material can thus be part of a copper damascene process, for instance. The alternating areas are formed by depositing and patterning the electrically conductive material, followed by depositing the dielectric material.

As will be discussed below, the dielectric material is typically deposited on the substrate by a spin-on process, in particular by, e.g., by spray-on or dip coating. It can also be deposited on the substrate by chemical vapor deposition.

Generally, the dielectric material under cure is a low molecular weight polymer having molecular weight between 1,000-10,000 g/mol. It can also be a high molecular weight polymer having molecular weight between 10,000-100,000 g/mol, and it can comprise a combination of low and high molecular weight polymers having molecular weight between 1,000-10,000 g/mol and 10,000-100,000 g/mol.

The low dielectric constant materials can be selected from the group of inorganic materials, organic materials and hybride materials.

Conventional inorganic dielectrics include PECVD-TEOS, thermal silicon dioxide, fluorosilicate glass (FSG) silicon nitride, and silicon oxynitride.

Organic dielectrics are exemplified by organic semi-aliphatic polyimides, aromatic polyimides, aromatic fluoropolyimides, aromatic ethers, such as poly(arylene ether)s and fluorinated poly(arylone ether)s, heterocyclic polymers, such as polyphenol quinolines, fluorinated polymers, such as perfluorooxy aliphatic, PTFE, amorphous fluorocarbon, Parylene-N, Parylene-F and perfluorocyclobutene (PFCB). They can also comprise products sold under commercial brand name such SILK (supplied by Dow Chemical).

Hybrid materials are, for example, silicone, siloxanes, silsequioxanes, such as methyl silsequioxane, hydrogen silsegnioxane and phenyl silsequioxane, carbon-doped silicone, diamond-like carbon and organosilicate glass, generally materials in which there is a silicon dioxide matrix to which organic groups have been covalently attached, and network-forming polymers where there are silicon-oxygen bridges within the matrix, such as benzocyclobutene (BCB). They can be also products that are sold under commercial brand name such as BLACK DIAMOND (supplied by Applied Materials), BLACK DIAMOND II (supplied by Applied Materials) and CORAL (supplied by Novellus), ZIRKON (supplied by Shipley) and LKD 5109 (supplied JSR).

All above mentioned materials may also contain so called porogens that are labile against temperature and which thus will decompose or evaporate away from the final polymer composition during the polymer curing process.

Preferred materials hydrogen silsequioxane dielectric materials, methylsilsesquioxane dielectric materials, phenylsilsesquioxane dielectric materials, organic dielectric materials, inorganic dielectric materials, and combinations thereof.

As a specific example of a suitable material, the following can be mentioned:

A silicon-containing chemical compound having the formula of

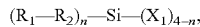

wherein $X_1$ is hydrogen, halogen, acyloxy, alkoxy or OH group, $R_2$ is an optional group and comprises an aromatic group having 6 carbon atoms and $R_1$ is a substituent at position 4 of $R_2$ selected from an alkyl, cyclo alkyl or polycyclo alkyl group having from 1 to 13 carbon atoms, an alkenyl group having from 2 to 5 carbon atoms, an alkynyl group having from 2 to 5 carbon atoms, Cl or F; and n is an integer 1-3.

As mentioned above, the nonporous dielectric material can be subjected to annealing or a similar pretreatment before being heated to the second temperature, i.e. the actual curing temperature. Annealing is carried out, e.g., by a process in which the material is subjected to UV radiation, DUV radiation, Extreme UV radiation, IR radiation or e-beam radiation or a combination thereof. The annealed material is then subjected to curing at an elevated temperature in air, nitrogen, argon, forming gas or vacuum.

There are a number of alternate way of achieving the curing. These are discussed in more detail below under Cure options I to V. Typically, rapid curing is provided with so called RTP (Rapid Thermal Processor) equipment, wherein the substrate and low-k dielectric structure is radiated with Infrared Radiation (IR) to achieve rapid increase in temperature and, thus, to cause rapid cure of the low-k dielectric structure. The temperature is increased by at least 1 degree C./second (or "ramp rate is equal to or higher than 1° C./second"). The heating or radiation source can be standard IR radiation source (or filament), such as a tungsten lamp, an ARC lamp or an inductively coupled heating source.

The pre-cure and rapid cure processes according to the present invention, result in a dielectric film free of silanols.

The annealed and cured (densified, crosslinked) material is subjected to deposition of a second layer selected from a metal, a barrier, a liner or an additional dielectric layer.

Based on the above, the present invention provides a process for preparing a siloxane-based dielectric material on a semiconductor substrate by hydrolysis and condensation of corresponding reactants, applying the prepared compositions on a substrate in the form of a thin layer, patterning the film by selective radiation and developing the radiated film and curing the formed structure.

Thus, in an embodiment of the above process, the material above is processed first by introducing a monomeric or polymerized material on a semiconductor substrate by a spin-on or CVD method, and then forming a siloxane polymer film on the semiconductor substrate by activating polymerization and densification reactions by rapid curing processing so as to produce a material having a relative dielectric constant lower than 2.6, preferably less than 2.5, in particular less than 2.4. Typically the dielectric constant is between 2.0 and <2.6.

The pore size of the nonporous dielectric material is less than 2 nm, the co-efficient of thermal expansion less than 20 ppm, and the thermal decomposition temperature higher than 450° C.

The electrically insulating material can be baked and patterned, with an electrically conductive material being deposited in removed areas of the patterned dielectric. The electrically conductive material comprises, for example, copper.

The above process is, e.g., a dual damascene process.

The deposition and patterning processes are described, for instance, in our earlier application PCT/FI03/00036, the disclosure of which is herewith incorporated by reference.

The following non-limiting examples illustrate the invention:

EXAMPLES

Synthesis of Molecules (#1) 4-(trifluoromethyl)phenyl trichlorosilane, 4-($F_3C$)$C_6H_4SiCl_3$ Preparation:

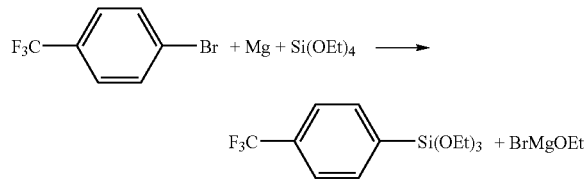

96.24 g (0.427 mol) 4-(trifluoromethyl)phenyl bromide, 10.38 g (0.427 mol) magnesium, and a small amount of iodine are stirred for half an hour. 356.78 g (382 ml, 1.708 mol) Si(OEt)$_4$ is added to solution. Et$_2$O is added until exothermic reaction occurs (~200 ml) and the solution is refluxed for over night. Et$_2$O is evaporated off and 250 ml n-heptane is added. Mg-salts are filtered off. n-heptane is evaporated and remaining 4-($F_3C$)$C_6H_4$Si(OEt)$_3$ is purified by distillation. B.p. 68° C./1 mbar. Yield 50.22 g (38%).

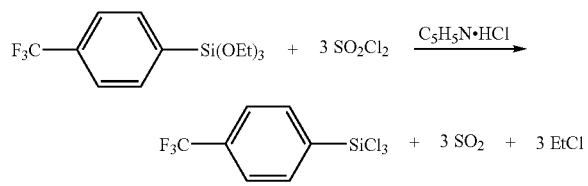

50.22 g (0.163 mol) 4-(trifluoromethyl)phenyl triethoxysilane, 83 mL (1.140 mol, 135.62 g) thionylchloride and 2.45 g (0.021 mol) pyridinium hydrochloride were refluxed and stirred for 16 h. Excess of SOCl$_2$ was evaporated and residue was fractionally distilled to obtain 37 g (81%) 4-(trifluoromethyl)phenyl trichlorosilane. B.p. 44° C./4.0 mbar.

Characterization:

4-(trifluoromethyl)phenyl triethoxysilane, 4-($CF_3$)$C_6H_4$Si(OEt)$_3$

NMR (Et$_2$O):

| $^{29}$Si: | −63.0 ppm |
|---|---|
| $^{13}$C: | 139.3 ppm (C$_1$) |
| | 137.4 ppm (C$_{2,6}$) |
| | 126.4 ppm (C$_{3,5}$) |
| | 134.4 ppm (qu, C$_4$), $^2J_{C4\text{-}F}$ 31.7 Hz |
| | 126.6 ppm (qu, C$_7$), $^1J_{C7\text{-}F}$ 271.4 Hz |
| | 60.8 ppm (C$_8$) |
| | 20.0 ppm (C$_9$) |

4-(trifluoromethyl)phenyl trichlorosilane, 4-($CF_3$)$C_6H_4SiCl_3$

NMR (Et$_2$O):

| $^{29}$Si: | −1.5 ppm |
|---|---|
| $^{13}$C: | 138.1 ppm (C$_1$) |
| | 136.0 ppm (C$_{2,6}$) |
| | 127.7 ppm (C$_{3,5}$) |
| | 137.0 ppm (qu, C$_4$), $^2J_{C4\text{-}F}$ 33.3 Hz |
| | 125.9 ppm (qu, C$_7$), $^1J_{C7\text{-}F}$ 272.2 Hz |
| $^{19}$F: | −65.3 ppm |

(#2) 3,5-Bis(trifluoromethyl)phenyl trichlorosilane, 3,5-($F_3C$)$_2C_6H_3SiCl_3$ Preparation:

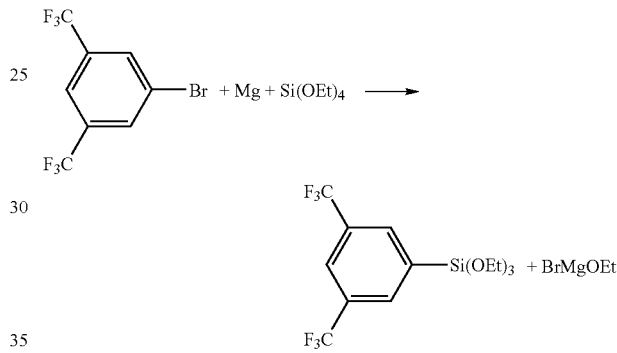

125.11 g (0.427 mol) 3,5-bis(trifluoromethyl)phenyl bromide, 10.38 g (0.427 mol) magnesium, and a small amount of iodine are stirred for half an hour. 356.78 g (382 ml, 1.708 mol) Si(OEt)$_4$ is added to solution. Et$_2$O is added until exothermic reaction occurs (~200 ml) and the solution is refluxed for over night. Et$_2$O is evaporated off and 250 ml n-heptane is added. Mg-salts are filtered off. n-heptane is evaporated and remaining 3,5-($F_3C$)$_2C_6H_3$Si(OEt)$_3$ is purified by distillation. B.p. 80° C./0.8 mbar. Yield 78.72 g (52%).

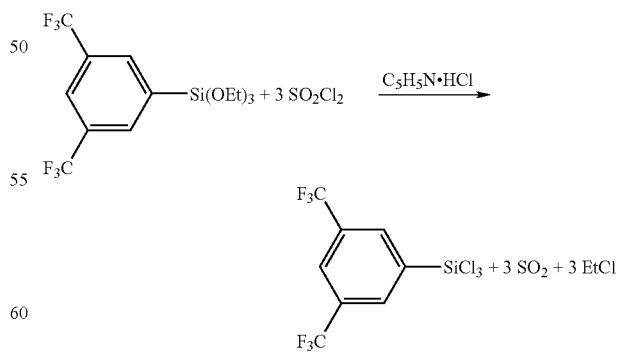

61.35 g (0.163 mol) 3,5-bis(trifluoromethyl)phenyl triethoxysilane, 83 mL (1.140 mol, 135.62 g) thionylchloride and 2.45 g (0.021 mol) pyridinium hydrochloride were refluxed and stirred for 16 h. Excess of SOCl$_2$ was evaporated and residue was fractionally distilled to obtain 44.2 g (78%) 3,5-bis(trifluoromethyl)phenyl trichlorosilane. B.p. 41° C./3.1 mbar.

(#3) Adamantyltrichlorosilane, $C_{10}H_{16}SiCl_3$

Preparation:
1. $C_{10}H_{15}Br + Mg \rightarrow C_{10}H_{15}MgBr$
2. $C_{10}H_{15}MgBr + Cl_2SiH_2 \rightarrow Cl_2SiH_2Cl + ClMgBr$ All the reactions are made under argon atmosphere. 150 ml $Bu_2O$ was added to a 1000 ml vessel. Solution was cooled down to $\leq -30°$ C. and 38.5 g (0.382 mol) $H_2SiCl_2$ was added to the vessel.

82.00 g (0.381 mol) 1-adamantylbromide, $C_{10}H_{15}Br$, and 51 g (2.10 mol) magnesium turnings were added to a 500 ml round bottomed flask followed by 85 ml $Bu_2O$. Exothermic reaction was cooled down by ice water bath. Solution was stirred for 2-3 hours at +55° C. Solution was then cooled down to room temperature and added to $H_2SiCl_2/Bu_2O$ solution. Temperature was kept below −30° C. during the addition. Solution was then stirred for over night allowing it slowly warm up to room temperature.

350 ml n-heptane was added to the vessel and the solution was filtered. Solvents were evaporated and the product, adamantylchlorosilane, was purified by distillation. B.p. 82° C. (1 mbar). Yield 12.6 g (16.5%).

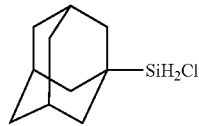

12.60 g (0.063 mol) $C_{10}H_{15}SiH_2Cl$, 150 ml tetrachloromethane $CCl_4$, and a catalytic amount of $PdCl_2$ were added to a 250 ml vessel. Solution was heated up to 70° C. and stirred for over night.

$CCl_4$ was evaporated and product, adamantyltrichlorosilane, was purified by distillation. B.p. 85° C. (0.7 mbar). Yield 15.25 g (90%).

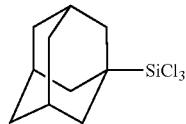

Other applicable precursors based on molecular modeling are but not limited to:

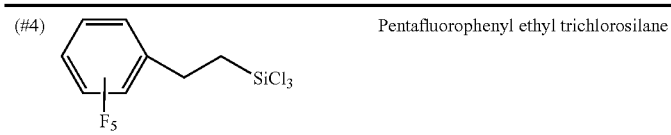 Pentafluorophenyl ethyl trichlorosilane

 Norbornyl trichlorosilane

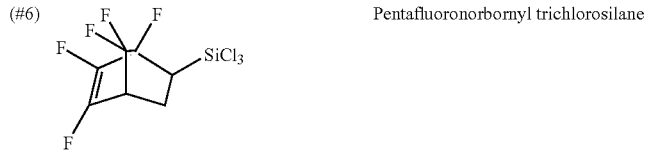 Pentafluoronorbornyl trichlorosilane

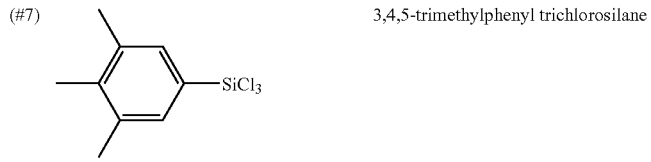 3,4,5-trimethylphenyl trichlorosilane

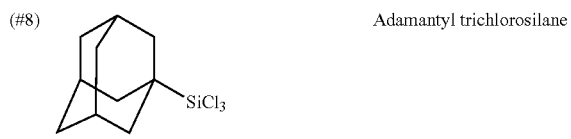 Adamantyl trichlorosilane

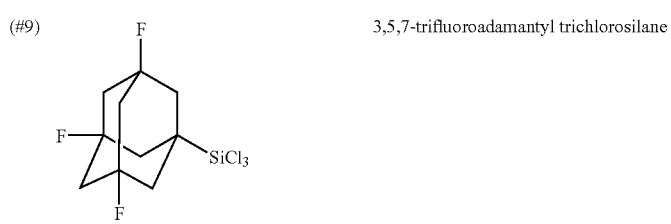 3,5,7-trifluoroadamantyl trichlorosilane

-continued

| | | |
|---|---|---|
| (#10) | [structure: adamantane with three CF₃ groups and SiCl₃] | 3,5,7-trifluoromethyladamantyl trichlorosilane |
| (#11) | [structure: adamantyl-phenyl-SiCl₃] | Adamantylphenyl trichlorosilane |
| (#12) | [structure: H₃C-phenyl(CF₃)-SiCl₃] | 3-trifluoromethyl-4-(methyl)phenyl trichlorosilane |
| (#13) | [structure: CF₃-cyclooctatetraene-SiCl₃] | 5-trifluoromethyl cyclooctatetraenetrichlorosilane |
| (#14) | [structure: CF₃-C₆F₄-CH₂-SiCl₃] | 4-trifluoromethyl tetrafluorophenyl methyl trichlorosilane |
| (#15) | | 3,5,7-trimethyladamantyl trichlorosilane |
| (#16) | | Adamantylethyltrichlorosilane |
| (#17) | | Adamantylpropyltrichlorosilane |
| (#18) | | Dimethyladamantyltrichlorosilane |

Formation of Polymers

Example A

Vinyl trichlorosilane (0.05 mol), 4-trifluoromethyl phenyl trichlorosilane (0.45 mol) and methyl trichlorosilane (0.55 mol) are dissolved in dehydrated DCM (800 ml). The solution is added drop-wise into a flask containing excess of water (45 mol) while stirring the solution.

After addition of the water, the solution stirred for 1 hour at the room temperature. The solution is neutralized by water extraction for 12 times and finally volatile components are evaporated with rotary evaporator. After vacuum treatment, dehydrated 400 w-% of mesitylene used as process solvent is added into the material and the material is carefully homogenized. Appropriate initiators are added and dissolved into the mixture. Finally the material is filtered.

Example B

Vinyl trichlorosilane (0.05 mol), adamantyltrichlorosilane (0.57 mol) and methyl trichlorosilane (0.38 mol) are dissolved in dehydrated DCM (800 ml). The solution is added drop-wise into a flask containing excess of water (45 mol) while stirring the solution. After addition of the water, the solution stirred for 1 hour at the room temperature. The solution is neutralized by water extraction for 12 times and finally volatile components are evaporated with rotary evaporator. After vacuum treatment, dehydrated 400 w-% of mesitylene used as process solvent is added into the material and the material is carefully homogenized. Appropriate initiators are added and dissolved into the mixture. Finally the material is filtered.

Alternative procedures for each stage:

Instead of DCM (dichloromethane) as a solvent any pure solvent or a mixture of solvents/alternate solvents can be used either by themselves or in combinations. Traditional methods of selecting solvents by using Hansen type parameters can be used to optimize these systems. Examples are acetone, dichloromethane, chloroform, diethyl ether, ethyl acetate, methyl-isobutyl ketone, methyl ethyl ketone, acetonitrile, ethylene glycol dimethyl ether, triethylamine, formic acid, nitromethane, 1,4-dioxane, pyridine, acetic acid, di-isopropyl ether, toluene, carbon disulphide, carbon tetrachloride, benzene, methylcyclohexane, chlorobenzene. Water used in the reaction can be dissolved into pure or mixtures of following solvents: acetone, dichloromethane, chloroform, diethyl ether, ethyl acetate, methyl-isobutyl ketone, methyl ethyl ketone, acetonitrile, ethylene glycol dimethyl ether, triethylamine, formic acid, nitromethane, 1,4-dioxane, pyridine, acetic acid, di-isopropyl ether, toluene, carbon disulphide, carbon tetrachloride, benzene, methylcyclohexane, chlorobenzene. In place of water, the following reagents can be used: deuterium oxide ($D_2O$) or HDO. A part of the water can be replaced with the following reagents: alcohols, deuterium alcohols, fluorinated alcohols, chlorinated alcohols, fluorinated deuterated alcohols, chlorinated deuterated alcohols. The reaction mixture may be adjusted to any appropriate temperature. Water can be added into the precursor solution. Even less than an equivalent amount of water can be used.

Instead of water extraction, neutralization (removal of the hydrochloric acid) can be performed using the following chemicals: sodium hydrogen carbonate ($NaHCO_3$), pure potassium hydrogen carbonate ($KHCO_3$), ammonium hydrogen carbonate ($NH_4HCO_3$), sodium carbonate ($Na_2CO_3$), potassium carbonate ($K_2CO_3$), sodium hydroxide (NaOH), potassium hydroxide (KOH), calcium hydroxide ($Ca(OH)_2$), magnesium hydroxide ($Mg(OH)_2$) ammonia ($NH_3$), trialkylamines ($R_3N$, where R is hydrogen or a straight/branched chain $C_xH_y$, x<10, as for example in triethylamine, or heteroatom containing as for example in triethanol amine), trialkyl ammonium hydroxides ($R_3NOH$, $R_3N$, wherein R is hydrogen or straight/branched chain $C_xH_y$, x<10), alkali metal silanolates, alkali metal silaxonates, alkali metal carboxylates. All neutralization reagents can be added into the reaction mixture also as a solution of any appropriate solvent. Acidic or basic water solution can be used in the extraction. Neutralization can be performed also with standard evaporation under vacuum or with azeotropic water evaporation. Procedure for azeotropic water evaporation: The solvent is evaporated off after the hydrolysis. The material is dissolved into mixture of water and one of the following solvents (1:10 volume/volume): tetrahydrofuran, ethanol, acetonitrile, 2-propanol, tert-butanol, ethylene glycol dimethyl ether, 2-propanol. The formed solution is evaporated to dryness. The material is dissolved again into the same mixture of water and the solvent. Evaporation and addition cycle is repeated until pH value of the material solution is 7. The solvent is then evaporated with rotary evaporator. The pressure in this stage can be in a large range. The material can be heated while vacuum treatment.

The molecular weight of formed polymer can be increased by using base or acid catalyzed polymerizations. By increasing the molecular weight, the mechanical properties of the film can be improved. On the other hand, a too large molecular weight may impair the film-forming process, e.g. the spinning. Thus, by controlling the molecular weight of the hydrolysed composition, processing of the composition and the properties of the film can be adjusted.

In the following, procedures for increasing the molecular weight are described in more detail:

Procedure for acid catalyzed polymerization: The pure material is dissolved into any appropriate solvent, such as tetrahydrofuran, ethanol, acetonitrile, 2-propanol, tert-butanol, ethylene glycol dimethyl ether, 2-propanol, toluene, dichloromethane, xylene, chloroform, diethyl ether, ethyl acetate, or methyl-isobutyl ketone. Into the solution, a catalytic amount of an acid, such as triflic acid, monofluoro acetic acid, trifluoro acetic acid, trichloro acetic acid, dichloro acetic acid, monobromo acetic acid, is added. The solution is refluxed for few hours or until polymerization has reached the desired level while water formed in the reaction is removed. After polymerization, the acid catalyst is removed from the material solution completely, for example by using solvent extraction or other methods described in alternative neutralization section. Finally, the solvent is removed.

Procedure for base catalyzed polymerization: The pure material was dissolved into an appropriate solvent, such as tetrahydrofuran, ethanol, acetonitrile, 2-propanol, tert-butanol, ethylene glycol dimethyl ether, 2-propanol, toluene, dichloromethane, xylene, chloroform, diethyl ether, ethyl acetate, or methyl-isobutyl ketone. Into the solution, a catalytic amount of a base, such as triethanol amine, triethyl amine, pyridine, ammonia, or tributyl ammonium hydroxide, is added. The solution is refluxed for few hours or until polymerization is reached the desired level while water formed in the reaction is removed. After polymerization, the base catalyst is removed from the material solution completely, for example by adding acidic water solution into the material solution. After that, the acidic solution is neutralized using solvent extraction or other methods described in alternative neutralization section. Finally, solvent is removed.

In the place of mesitylene it is possible to use pure or mixture of following solvents: methyl-isobutyl ketone, 2-propanol, ethanol, butyl acetate, methanol, 1-propanol, tetrahydrofuran, acetone, nitromethane, chlorobenzene, dibutyl ether, cyclohexanone, 1,1,2,2-tetrachloroethane, trichloroethanes, ethyl lactate, 1,2-propanediol monomethyl ether acetate, carbon tetrachloride, perfluoro toluene, perfluoro p-xylene, perfluoro iso-propanol, tetraethylene glycol, 2-octanol, dimethyl sulfoxide, 2-ethyl hexanol, 3-octanol, diethyleneglycol butyl ether, diethyleneglycol dibutyl ether, diethylene glycol dimethyl ether, n-propoxy propanol, 1,2,3,4-tetrahydronaphtalene or trimethylol propane triacrylate. The material solution can be acidified using following acids: acetic acid, formic acid, propanoic acid, monofluoro acetic acid, trifluoro acetic acid, trichloro acetic acid, dichloro acetic acid, monobromo acetic acid. Also following basic compounds can be added into the material solution: triethyl amine, triethanol amine, pyridine, N-methylpyrrolidone. Mesitylene on any other synthesis or process solvent can be introduced in any stage by keeping material all the time in liquid form. Therefore formation of solvent free material during synthesis between certain stages is not necessary. This, sometimes beneficial operation can be done by using so called solvent replacement method. In this method, a solvent having lower boiling point can be replaced in the solution with another solvent having higher boiling point. By adding higher boiling point solvent into the solution followed by evaporation-addition-cycles, the solvent with lower boiling point will be replaced gradually with the other solvent or solvent mixture of any desired dilution.

Photoinitiators that can be used are IRGACURE 184, IRGACURE 500, IRGACURE 784, IRGACURE 819, IRCACURE 1300, IRGACURE 1800, DAROCURE 1173 and DAROCURE 4265. The initiator can be highly fluorinated, such as 1,4-bis(pentafluorobenzoyl)benzene or RHODOSIL 2074. Thermal initiators which call be used are benzoyl peroxide, 2,2'-azobisisobutyronitrile, 1,1'-Azobis (cyclohoxanecarbo-nitrile), tert-butyl hydroperoxide, Dicumyl peroxide and Lauroyl peroxide. Not necessarily limited to these. Thermal initiators are optimized for their reactivity, thermal stability as wall as chain transfor efficiencies. Typical radical initiators listed below work well with the system as well as other charge transfer catalysts that can be used as initiators.

Anhydrous inorganic compounds, including but not limited to sulfate compounds such as sodium sulfate ($Na_2SO_4$) or magnesium sulfate ($MgSO_4$), may be used to remove water and moisture out of organic as well as organic-inorganic solutions. These compounds are insoluble to most organic solvents and they easily bind water to so called crystal water.

This innovation describes the usage of anhydrous inorganic compounds as novel and effective drying (removal of water) agents of metalalkoxide and organo-metal chloride based optical materials in ethyl acetate, toluene or tetrahydrofurane solutions. Removal of water and moisture is crucial to minimize optical losses due the entrapped water molecules into the final optical material. The drying is proceeded by adding appropriate amount of drying agent into the solution. The amount was based on character of the drying agent and on amount of water to be removed. It is safe to use excess of the drying agent. The dried solution was then filtered and the solvent was evaporated off. Trace of solvent was removed with high vacuum treatment.

Tetrahydrofurane, ethyl acetate and toluene form azeotrope with water when boiled. So if the drying with these agents was not complete the remaining water was removed when the solvent was evaporated.

The use of drying agents may slightly increase inorganic impurities of the optical material at least if the drying is not completed before evaporation of the solvent.

Example C

In one embodiment, the present invention relates to a chemical vapor deposition (CVD) process and more preferably a plasma enhanced chemical vapor deposition (PECVD) process for forming a low-k dielectric thin film on a substrate, including the steps of: placing the substrate in a chemical vapor deposition apparatus, introducing at least one vaporized organosilicon precursor comprising at least one cleavable organic functional group into the apparatus; transporting the organosilicon vapor into a chemical vapor deposition zone containing a substrate, optionally using a carrier gas to effect such transport; contacting the organosilicon vapor with the substrate under chemical vapor deposition conditions to deposit a thin film comprising an organosilicon composition; and activating the organosilicon thin film to produce a low-k dielectric thin film. The activation step is carried out under conditions sufficient to effect the removal of at least a portion of the cleavable, organic functional groups, and optionally to activate at least a portion of cross-linking functional groups (if present), to produce a thin film having a dielectric constant of less than 2.7. Useful sources of activation include but are not limited to chemical generation of free radicals, plasma, pulsed plasma, chemical quenching agents, co-reactants, initiators and combinations thereof.

In method A, a low-k dielectric material structure containing organic silicon dioxide composition is formed by a CVD process using a reactive gas containing 4-(trifluoromethyl) phenyl triethoxysilane. Therefore, a functional organic silicon dioxide structure is formed in which 4-(trifluoromethyl) phenyl group is bonded to a silicon atom. Accordingly to the method a conventional CVD system can be applied so that organic content in such a film can be 40 at.-% or higher and respectively dielectric constant of the of the material structure is 2.7 or lower and more preferably less than 2.4. Alternatively, all above-mentioned precursors can be applied either alone or in combination with each other or with conventional CVD precursors, such as tetraethylorthosilicate or methyl triethoxysilane. The film can adhere strongly to organic film, hybrid organic-inorganic film, metal film, high-k dielectric, barrier or liner films or other similar films.

Example D

The materials are deposited as in example C and the formed films are radiation exposed (UV, DUV, Extreme UV, IR or e-beam) prior to further treatments, such as curing at elevated temperatures in air, nitrogen, argon, forming gas or vacuum or prior second layer deposition such as metal, barrier, liner or additional dielectric layer deposition, which can be either regular dielectric film, low-k dielectric film or high-k dielectric film. The exposed can be applied through a mask or reticle or alternatively in a flood exposure manner. The exposure step can also be followed by a development step or elevated temperature-curing step.

Thus, in addition to thermally and plasma-generated reactive intermediates, photon assisted precursor cracking is also part of this invention. Because specific chemical bonds have specific energies, and because these energies can be supplied as photons, electromagnetic radiation is a preferred method of practicing this invention.

According to an exemplifying embodiment, precursors are stored in a precursor container and then flow through a pipe into a reactor tube for UV photolytic cracking of the precursor. For infrared (IR) cracking of the precursor, the reactor can be made of glass. For vacuum ultraviolet photolytic cracking of the precursor, the reactor can be made of $MgF_2$, LiF, or $CaF_2$. An ultraviolet (UV) source can be further used to photolytically dissociate the precursor. Alternatively, a vacuum ultraviolet (VUV) source can be used. An infrared (IR) source can be used, which heats the precursors to provide a combination of thermolytic and photolytic cracking. After cracking, the intermediates pass into a deposition chamber, which is heated by a resistive heater to prevent deposition of intermediates on the walls of the chamber. The flow of intermediates is adjusted using a flow adjuster. A wafer onto which the precursor is applied is maintained at low temperatures by a conventional cooling device, using liquid nitrogen, reverse Peltier effect, or any other cooling apparatus known in the art.

Using the photolytic method, the dissociation reaction can be very selective and efficient if appropriate photon sources are used. The photon sources can be provided by ultraviolet (UV) light generated by mercury vapor discharge or metal halide lamps. Exemplary sources of UV radiation for transport polymerization can include (1) a mercury lamp that provides from 50 to 220 mWatts/$cm^2$ of UV ranging from 200 to 450 nm or (2) a metal halide lamp that provides from 40 to 160 mWatts/$cm^2$ of UV ranging from 260 nm to 450 nm. These UV sources provide photon energies ranging from 2 to 5 eV, which are sufficient for generating many radical intermediates.

An alternative to conventional UV light is vacuum ultraviolet (VUV). Incoherent excimer radiation can provide a large number of UV and VUV wavelengths for photolytic processing of various chemicals. The preferred source is incoherent excimer radiation derived from dielectric barrier discharge. UV and VUV photons that are in the ranges of 3 to 5 eV are especially useful.

However, the energies of mercury vapor or metal halide UV radiation are too small to be useful for rapid transport polymerization. The desired residence time within the cracking chamber, which is the time available for photolysis should be in the range of a few milliseconds to several hundred milliseconds. Therefore, VUV is the most desirable form of energy for photon assisted transport polymerization. VUV or incoherent excimer UV sources can be provided by dielectric barrier or silent discharge.

When IR incoherent excimer irradiation is used, the conventional stainless steel or ceramic pipe or reactor used in the pyrolyzer will have to be replaced with a quartz tube or reactor. When using UV, a transparent tube can be made of any UV transparent material such as quartz, preferably a single quartz crystal. When using VUV, the transparent tube must be made of a material transparent to VUV wavelengths. Crystals of MgF2, LiF, or CaF2 are preferred.

General process description of rapid curing process:

Wafer or substrate with deposited or formed and pre-annealed or as deposited film is loaded into the rapid thermal processing tool at desired temperature. If necessary, oxygen is removed by vacuum or by purging with gas. Processing can be done in vacuum or in a gas atmosphere. Processing gas can be, but is not limited to, Ar, $N_2$ or He. Ramp rate, cure temperature and time, cooling down rate is defined but not limited to. Curing time at maximum temperature can vary from seconds up to the maximum curing time with the tool, e.g., several hours. Longer curing times can be achieved by using multiple step processing (cure→cool→cure etc.). Equipment can be cooled down freely or at desired rate to desired temperature. Following curing, steps can have similar or different parameters.

Process Example:

Eight samples were prepared from Material B explained in the material example B by spin-on deposition and deposited on a n-type silicon wafer and pre-cured on a hot-plate for 5 minutes at 200 deg C. prior to rapid curing process. Various process temperature conditions were tested in the rapid curing process so that dT was varied between 150 and 425 deg C. (dT=temperature difference at start and final process temperature). In all tests, the final temperature was 450 deg C. and the curing time at given temperature was 5 minutes.

Dielectric constants were measured from five MOS-capacitor devices on each wafer sample. Applied measurement frequency was 100 kHz. A table and graph below present mean dielectric constant values with different dT values.

With high dT values the dielectric constants are considerably lower than the dielectric constant of a predetermined value.

The predetermined value is obtained by curing a as deposited or pre-cured sample in a conventional diffusion furnace, wherein the loading temperature of sample in to the furnace is 200 deg C., the temperature ramp rate was 10 deg C./minute and final curing temperature was 425 deg C. (or higher) for 60 minutes. This predetermination results in a dielectric constant of approximately 2.60 or higher.

TABLE 1

Dielectric constants and temperature differences of 7 samples

| Sample # | Delta T (degC.) | Dielectric Constant (mean) |
| --- | --- | --- |
| 1 | 425 | 2.36 |
| 2 | 370 | 2.43 |
| 3 | 330 | 2.44 |
| 4 | 325 | 2.50 |
| 5 | 275 | 2.53 |
| 6 | 200 | 2.60 |
| 7 | 175 | 2.62 |

All samples exhibited a porosity volume of less than 20% and a pore radius of approximately 1 nm or less measured with porosity ellipsometer technique. Young's modulus of all samples was 4 GPa or higher. Co-efficient of thermal expansion (CTE) of the material on all samples was less than $20*10^{-6}$ 1/deg C.

TABLE 2

Properties of material examples based on compositions A and B

| Low-k Material | Material example A | Material example B |
| --- | --- | --- |
| Dielectric constant | 2.39 | 2.36 |
| Leakage (nA/cm2) | <1 | <1 |
| Breakdown voltage (MV/cm) | >2.5 | >2.5 |
| Loss tangent at 1MHz | not measured | 0.0002 |
| Pore radius (nm) | 0.6 | 0.7 |
| Pore volume (%) | 14 | 17 |
| Modulus, nanoindentation (GPa) | not measured | 6.4 |
| Modulus, Flexus (GPa) | 4.6 | 5.4 |
| Decomposition temp. (° C.) | 490 | 470 |
| Water absorption (FTIR) | No detection | No detection |

The etch rate of the rapid curing processed film made of material B is approximately 470 nm, which is similar to silicon dioxide dielectric films. The etch rate was studied with parallel plate etcher (Lam 590) with gas combination of $CF_4$, $CHF_3$ and helium and applied power was 800 W.

Cure Option I:

Rapid curing is generated with so called RTP (Rapid Thermal Processor) equipment, wherein the substrate and low-k dielectric structure is radiated with Infrared Radiation (IR) to overcome rapid increase in temperature and thus cause rapid cure of the low-k dielectric structure, i.e., ramp rate equal or higher than 1° C./second. The heating or radiation source can be standard IR radiation source (or filament) such as tungsten lamp, ARC lamp or inductively coupled heating source. The system typically also contains reflectors to direct the radiation uniformly to the material under cure such as in this case the low-k dielectric structure. The system may also contain emissivity control system that allows for accurate curing conditions of the low-k dielectric structure.

Cure Option II:

The rapid curing of the low-k dielectric structure is carried out in a manner of sequence of hot plates that can be vertically or laterally positioned. A substrate holding the low-k dielectric structure is then (preferably in a controlled atmosphere such as $N_2$, argon, helium, hydrogen or forming gas) handled from hot plate to another with computer-controlled robot. The system should contain at least two positions for a substrate: a cold (cooler than the second position) position and a hot position (wherein the final curing of the low-k dielectric is taken its place). However, multiple hot plates with various different temperatures may be applied.

The temperature differences and robot substrate handling speed is adjusted so that rapid curing, i.e., a ramp rate equal of higher than 1° C./second, becomes possible.

Cure Option III:

The low-k structure/film curing is done in so called RTP (Rapid Thermal Processing) chamber configured to receive one or more substrates. The RTP housing chamber also includes a heat member or heating plate. Disposed on a periphery of the heating member is a heat source. Heat energy radiating from the heat source conducts through the heating member to create an isothermal temperature distribution across the heating member. Substrate supports are included on the heating member, which support the substrate in close proximity to the heating plate, such that the temperature of the heating plate establishes the temperature of the substrate. In addition, a plurality of heating members maybe stacked together within the process chamber. In this manner, the heating plates may be positioned above and below the substrate, such that the temperature on both heating plates influences the temperature distribution of across the water.

The key aspect of the system applied here is that the curing of low-k dielectric structure is applied rapidly, i.e., ramp rate equal of higher than 1° C./second.

Cure Option IV:

The curing is carried out in a system that provides an isothermal heat distribution and temperature across a substrate having a structure of dielectric material. The furnace system here includes a processing tube configured to removably receive a substrate carrier preferably in controlled atmosphere (for example $N_2$, argon, helium, hydrogen or forming gas) having a full compliment of substrates. The heating assembly is positioned in such a way that heating element (for example resistive) is applicable to heat process gas while entering into the process tube. Here the process tube and furnace are also positioned so that they capable of being vertically raised and lowered into a position enclosing the heating assembly within the process tube. The speed of the lowering and raising of this small thermal mass system is carefully controlled and thus heating speed to the low-k structure on a substrate is controlled and rapid curing becomes possible, i.e., heating ramp rate equal or higher than 1° C./s. Once the heating assembly forms a seal with the process tube, the process tube is exhausted and purged of process gas. The process gas can be pre-heated before entering into the process tube. The gas can also be circulated through the process tube to convectively change the temperature of the wafers. The heating element may also include a reflector device, which can direct gas flow around the element and through the process tube. After the low-k material is cured sufficient time but at least 30 seconds at elevated temperature, the heating element is powered down and a non-heated gas is allowed to flow through the process tube to cool down the wafer carrier, the substrates and the low-k structures on the substrates.

Cure Option V:

Any of the curing methods described above (curing methods I-IV) is combined with simultaneous radiation exposure such as electron beam, ion beam, UV, Deep UV, extreme UV, microwave or similar. More specifically the low-k dielectric structure is exposed to radiation during the rapid curing process that enhances the cross-linking and curing of the low-k dielectric structure.

We claim:

1. A method of forming a low dielectric constant structure, comprising the steps of:
    providing on a substrate a non Si—H containing dielectric material having a first elastic modulus; and
    curing the dielectric material whereby the material is heated from a first temperature to a second temperature by increasing the temperature at an average rate of at least 1° C. per second or more, to produce a dielectric material having a second elastic modulus, which is greater than the first elastic modulus;
    wherein the dielectric material is formed from a precursor that is a silicon-containing chemical compound having the formula $(R_1\text{—}R_2)_n\text{—}Si\text{—}(X_1)_{4-n}$, wherein
    $X_1$ is halogen, acyloxy, alkoxy or OH group,
    $R_2$ is an optional group and comprises an aromatic group having 6 carbon atoms and
    $R_1$ is a substituent at position 4 of $R_2$ selected from an alkyl, cyclo alkyl or polycyclo alkyl group having from 1 to 13 carbon atoms, an alkenyl group having from 2 to 5 carbon atoms, an alkynyl group having from 2 to 5 carbon atoms, Cl or F; and
    n is an integer 1-3; and
    is an organosiloxane polymeric material selected from the group consisting of methylsilsesquioxane, phenylsilsesquioxane, methylphenylsilsesquioxane, methylvinylsilsesquioxane, phenylvinylsilsesquioxane, vinylsilsesquioxane, methylphenylvinylsilsesquioxane; adamantyl or adamantyl derivative containing silsesquioxane; and perfluorinated or partially fluorinated aryl, alkyl or aryl-alkyl containing silsesquioxane.

2. The method according to claim 1, wherein the temperature difference between the second and the first temperature is at least 200° C.

3. The method according to claim 2, wherein the temperature difference between the first and second temperature is in the range of from 225 to 425° C.

4. The method according to claim 3, wherein the temperature difference between the first and second temperatures is at least 300° C.

5. The method according to claim 1, wherein the dielectric material is heated to a second temperature by increasing the temperature at an average rate of at least 1° C. per second or more.

6. The method according to claim 5, wherein the dielectric material is heated to a second temperature by increasing the temperature at an average rate of from 10 to 50° C. per second.

7. The method according to claim 1, wherein the first temperature is room temperature.

8. The method according to claim 1, wherein the temperature is increased over a time period of 5 minutes or less.

9. The method according to claim 8, wherein the increase in temperature occurs over a time period of 1 minute or less.

10. The method according to claim 1, wherein the temperature is increased from the first temperature to the second temperature at a heating rate of at least 10° C. per second.

11. The method according to claim 10, wherein the heating rate is at least 30° C. per second.

12. The method according to claim 1, wherein the dielectric constant of the dielectric material is 2.60 or less.

13. The method according to claim 12, wherein the dielectric constant of the dielectric material after curing is 2.50 or less.

14. The method according to claim 13, wherein the dielectric constant of the dielectric material after curing is 2.40 or less.

15. The method according to claim 1, wherein the porosity of the dielectric material is less than 15%.

16. The method according to claim 1, wherein the average pore-size is less than 1 nm.

17. The method according to claim 1, wherein the Young's modulus of the film is higher than 4 GPa after curing.

18. The method according to claim 17, wherein the Young's modulus of the film is higher than 5 GPa after curing.

19. The method of claim 1, wherein the change in elastic modulus is 4 GPa or higher.

20. The method according to claim 1, wherein substrate is a semiconductor substrate.

21. The method of claim 20, wherein the dielectric material is provided on said semiconductor substrate in alternating areas with an electrically conductive material.

22. The method of claim 21, wherein the electrically conductive material comprises aluminum.

23. The method of claim 21, wherein the electrically conductive material comprises copper.

24. The method of claim 21, wherein the alternating areas are formed by depositing and patterning the dielectric material, followed by depositing the electrically conductive material.

25. The method of claim 24, wherein the depositing of the dielectric material and electrically conductive material is part of a copper damascene process.

26. The method of claim 21, wherein the alternating areas are formed by depositing and patterning the electrically conductive material, followed by depositing the dielectric material.

27. The method according to claim 1 or 20, wherein the dielectric material is deposited on the substrate by a spin-on process.

28. The method according to claim 1 or 20, wherein the dielectric material is deposited on the substrate by spray-on or dip coating.

29. The method according to claim 1 or 20, wherein the dielectric material is deposited on the substrate by chemical vapor deposition.

30. The method according to claim 1, wherein the dielectric material under cure is a low molecular weight polymer having molecular weight between 1,000-10,000 g/mol.

31. The method according to claim 1, wherein the dielectric material under cure is a high molecular weight polymer having molecular weight between 10,000-100,000 g/mol.

32. The method according to claim 1, wherein the dielectric material under cure is a combination of low and high molecular weight polymers having molecular weight between 1,000-10,000 g/mol and 10,000-100,000 g/mol.

33. The method according to claim 1, wherein the dielectric material under cure contains thermally labile porogens.

34. The method according to claim 1, wherein the dielectric material is subjected to pre-annealing before curing.

35. The method according to claim 34, wherein the annealing is carried out by a process in which the material is subjected to electromagnetic radiation.

36. The method according to claim 35, wherein the electromagnetic radiation is selected from UV radiation, DUV radiation, Extreme CV radiation and IR radiation or a combination thereof.

37. The method according to claim 34, wherein the annealing is carried out by a process in which the material is exposed to an electron-beam.

38. The method according to claim 35, wherein the dielectric material after curing is subjected to annealing in an atmosphere of air, nitrogen, argon, oxygen, hydrogen, helium, forming gas or vacuum.

39. The method of claim 34 or 38, wherein after the annealing and curing steps the dielectric material comprises less than 1 wt % of silanols.

40. The method of claim 34 or 38, wherein after the annealing and curing steps, the dielectric material is free of silanols.

41. The method according to claim 34, wherein the annealed material is subjected to the deposition of a second layer selected from a metal, a diffusion barrier, a liner, a hard mask or an additional dielectric layer.

42. The method according to claim 1, wherein the pore size is of the dielectric material is less than 2 nm.

43. The method according to claim 1, wherein co-efficient of thermal expansion of the dielectric material is less than 35 ppm.

44. The method according to claim 1, wherein thermal decomposition temperature of the dielectric material is higher than 450° C.

45. The method according to claim 1, wherein the dielectric material has a dielectric constant of from 2.1 to 2.3.

46. The method of claim 1, wherein the density of the dielectric material after curing is 1.0 g/cm$^3$ or more.

47. The method according to claim 1, wherein an average pore size of the dielectric material is less than 2 nm.

48. The method according to claim 1, wherein a coefficient of thermal expansion of the dielectric material is less than 20 ppm.

49. The method according to claim 1, wherein a co-efficient of thermal expansion of the dielectric material is less than 15 ppm.

50. The method according to claim 1, wherein a co-efficient of thermal expansion of the dielectric material is less than 10 ppm.

51. The method according to claim 1, wherein a thermal decomposition temperature of the dielectric material is higher than 455° C.

52. The method according to claim 1, wherein a thermal decomposition temperature ot the dielectric material is higher than 460° C.

53. The method according to claim 1, wherein a thermal decomposition temperature of the dielectric material is higher than 470° C.

54. The method of claim 1, wherein the rapid thermal heating is achieved by using a heating or radiation source selected from IR radiation sources and filaments.

55. The method according to claim 54, wherein the heating or radation source is selected from tungsten lamps, ARC lamps and inductively coupled heating sources.

* * * * *